(12) United States Patent
Berge et al.

(10) Patent No.: US 11,439,015 B2
(45) Date of Patent: Sep. 6, 2022

(54) SURFACE MOUNT DEVICE PLACEMENT TO CONTROL A SIGNAL PATH IN A PRINTED CIRCUIT BOARD

(71) Applicant: International Business Machines Corporation, Armonk, NY (US)

(72) Inventors: Layne A. Berge, Rochester, MN (US); Paul E. Dahlen, Rochester, MN (US); Pat Rosno, Rochester, MN (US); Timothy Schmerbeck, Mantorville, MN (US); Kyle Schoneck, Rochester, MN (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 277 days.

(21) Appl. No.: 16/598,126

(22) Filed: Oct. 10, 2019

(65) Prior Publication Data
US 2021/0112661 A1    Apr. 15, 2021

(51) Int. Cl.
| H05K 1/18 | (2006.01) |
| H05K 1/11 | (2006.01) |
| H05K 3/30 | (2006.01) |
| H05K 1/02 | (2006.01) |

(52) U.S. Cl.
CPC ......... *H05K 1/181* (2013.01); *H05K 1/0237* (2013.01); *H05K 1/111* (2013.01); *H05K 3/303* (2013.01); *H05K 1/115* (2013.01); *H05K 2201/09418* (2013.01); *H05K 2201/1003* (2013.01); *H05K 2201/10015* (2013.01); *H05K 2201/10022* (2013.01)

(58) Field of Classification Search
CPC ...................................................... H05K 1/181
USPC ...................................................... 174/260
See application file for complete search history.

(56) References Cited

U.S. PATENT DOCUMENTS

| 5,537,295 A | 7/1996 | Van Den Bout et al. |
| 5,625,780 A | 4/1997 | Hsieh et al. |
| 5,801,601 A * | 9/1998 | Gayle ....................... H01P 7/00 333/156 |
| 6,394,853 B1 | 5/2002 | Hammond et al. |
| 2012/0168216 A1* | 7/2012 | Chan ..................... H05K 1/0231 174/260 |
| 2015/0015453 A1* | 1/2015 | Puzella ................ H05K 1/0206 343/853 |
| 2015/0194591 A1* | 7/2015 | Fujii .................... H01L 41/0825 318/116 |
| 2016/0165715 A1 | 6/2016 | Kahrimanovic |
| 2020/0274239 A1* | 8/2020 | Amano ................ H01Q 1/2266 |

(Continued)

*Primary Examiner* — Stanley Tso
(74) *Attorney, Agent, or Firm* — Erik Johnson

(57) ABSTRACT

Surface mount device (SMD) placement to control a signal path in a printed circuit board (PCB), including: adding, to a PCB, a plurality of signal path segments, each signal path segment of the plurality of signal path segments ending at corresponding pad of a plurality of pads, wherein a first pad of the plurality of pads is couplable to a second pad of the plurality of pads to create a first signal path and is couplable to a third pad of the plurality of pads to create a second signal path; and coupling, via a discrete SMD, the first pad and the second pad to create the first signal path comprising a first signal path segment of the plurality of signal path segments and a second signal path segment of the plurality of signal path segments.

20 Claims, 5 Drawing Sheets

(56) References Cited

U.S. PATENT DOCUMENTS

2020/0293841 A1\* 9/2020 Yang ................... G06K 13/06
2020/0344964 A1\* 11/2020 Weiler ................ G05B 19/048

\* cited by examiner

SURFACE MOUNT DEVICE PLACEMENT TO CONTROL A SIGNAL PATH IN A PRINTED CIRCUIT BOARD

BACKGROUND

Field of the Invention

The field of the invention is data processing, or, more specifically, methods, printed circuit boards, and apparatuses for surface mount device (SMD) placement to control a signal path in a printed circuit board (PCB).

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Printed circuit boards (PCB) may be capable of utilizing multiple signal paths in the same PCB. Typically, this requires the use of switches or other components that use large areas of PCB space.

SUMMARY

Surface mount device (SMD) placement to control a signal path in a printed circuit board (PCB) may include adding, to a PCB, a plurality of signal path segments, each signal path segment of the plurality of signal path segments ending at corresponding pad of a plurality of pads, wherein a first pad of the plurality of pads is couplable to a second pad of the plurality of pads to create a first signal path and is couplable to a third pad of the plurality of pads to create a second signal path; and coupling, via a discrete SMD, the first pad and the second pad to create the first signal path comprising a first signal path segment of the plurality of signal path segments and a second signal path segment of the plurality of signal path segments.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1A:
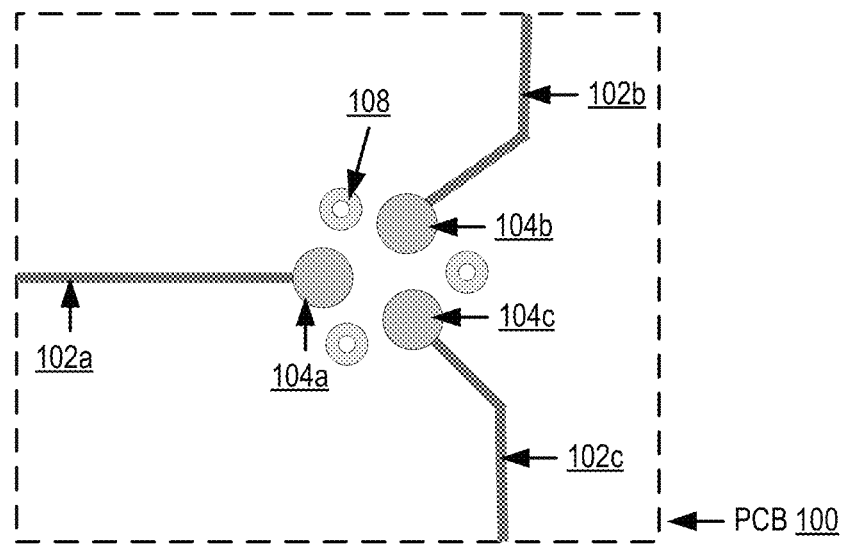
FIG. 1A is a view of an example printed circuit board (PCB) for surface mount device (SMD) placement to control a signal path in a printed circuit board.

Exemplary methods, printed circuit boards, and apparatuses for surface mount device (SMD) placement to control a signal path in a printed circuit board (PCB) in accordance with the present invention are described with reference to the accompanying drawings, beginning with FIG. 1A. FIG. 1A sets forth a diagram of a portion of a printed circuit board (PCB) 100 configured for surface mount device (SMD) placement to control a signal path in a PCB according to embodiments of the present invention. The PCB 100 of FIG. 1A may be included in an apparatus (e.g., a computing device, other hardware components). Such an apparatus may be included in a system of apparatuses or devices. The PCB 100 of FIG. 1A depicts a subsection of a PCB (e.g., a radio frequency (RF) PCB) as would be appreciated by one skilled in the art. The PCB 100 includes signal path segments 102*a*, 102*b*, 102*c*. Each signal path segment 102*a,b,c* comprises a trace or etching in the PCB 100 capable of carrying a signal. Each signal path segment 102*a,b,c* includes, as an endpoint, a corresponding pad 104*a,b,c*. Each signal path segment 102*a,b,c* may also include other intermediary components, such as surface mount devices (SMDs) or other components capable of carrying a signal from a signal source to a signal destination. As each signal path segment 102*a,b,c* includes, as an endpoint, a corresponding pad 104*a,b,c*, the signal path segments 102*a,b,c* are, as shown, incapable as serving as a complete signal path in the PCB 100.

Each signal path segment 102*a,b,c* is configured such that two or more exclusive, non-identical subsets of signal path segments 102*a,b,c* may be coupled to create a signal path through the PCB 100 (e.g., a path in the PCB 100 capable of carrying a signal from the signal source to a signal destination. In other words, at least one of the signal path segments 102*a,b,c* is capable of being non-simultaneously coupled to two or more other signal path segments 102*a,b,c*, to create two or more signal paths. A third, uncoupled signal path segment 102*a,b,c* may be uncoupled and thereby excluded from a signal path. For example, signal path segments 102*a* and 102*b* may be coupled to create a first signal path, while signal path segments 102*a* and 102*b* may be coupled to create a second signal path. In this example, the first signal path and second signal path are non-identical in that they differ in at least one signal path segment (e.g., signal path segments 102*b* or 102*c*). The first signal path and second signal path are non-exclusive in that the first signal path and the second signal path may not exist in the PCB 100 at the same time, as the signal path segment 102*a* cannot be coupled to both the signal path 102*b* and 102*c*.

A discrete surface mount device (SMD) may be used to couple pairs of pads 104*a,b,c*, thereby coupling their corresponding signal path segments 102a,b,c. For example, a discrete SMD may be soldered or otherwise conductively attached to a pair of pads 104a,b,c to create a signal path from a pair of corresponding signal path segments 102a,b,c. An SMD is discrete in that it does not require external power to operate. Examples of discrete SMDs include capacitors, indictors, or resistors. Accordingly, the pads 104a,b,c may be added to the PCB or arranged based on a dimension of an SMD that may couple pairs of pads 104a,b,c. For example, assuming a known distance between pins of a capacitor, the pads 104a,b,c may be arranged such that each pad 104a,b,c is a distance from at least one other pad 104a,b,c that is less than the distance between the pins of the capacitor. The pads 104a,b,c may be arranged such that each pad 104a,b,c is equidistant from the two nearest other pads 104a,b,c, thereby forming a regular geometric arrangement (e.g., equilateral triangle, square, pentagon, etc. depending on the number of pads used).

The PCB 100 also includes a plurality of ground (GND) vias 108. The GND vias 108 may be arranged such that each GND via 108 is equidistant from two pads 104a,b,c. For example, the GND vias 108 may be placed in a regular geometric arrangement (e.g., equilateral triangle, square, pentagon, etc., where the number of GND vias 108 equals the number of pads 104a,b,c used. In the example PCB 100, the pads 104a,b,c and GND vias 108 are each arranged in equilateral triangles such that each pad 104a,b,c is equidistant from two other pads 104a,b,c and two GND vias 108. One skilled in the art that other geometric arrangements may be used depending on the number of pads 104a,b,c and GND vias 108 to be placed. The regular geometric placement of the pads 104a,b,c and GND vias allows for signals in the PCB 100 to not experience substantial reflection. Such arrangements have been tested through simulation to provide good RF performance.

The example PCB 100 may be configured with three different signal paths: a first signal path formed by signal path segments 102a and 102b, a second signal path formed by signal path segments 102a and 102c, and a third signal path formed by signal path segments 102b and 102c. Thus, the same PCB 100 may be configured to use three different signal paths by placing the discrete SMD at different locations. Moreover, a PCB 100 configured to use one of the signal paths may be reconfigured (e.g., by a technician or other operator) to use a different signal path by moving or replacing the discrete SMD with an SMD at a different location (e.g., coupling a different pair of pads 104a,b,c). This enables a PCB 100 to use multiple signal paths without switching hardware or other dedicated components that take up comparatively greater space on the PCB 100.

One skilled in the art would appreciate that other arrangements of signal path segments may be implemented (e.g., using additional signal path segments and/or different arrangements of couplable signal path segments) to create different arrangements of possible signal paths in the same PCB 100. Additionally, one skilled in the art would appreciate that one or more of the signal path segments 102a,b,c may terminate in another pad and is therefore couplable to other groupings of signal path segments at the other endpoint. Accordingly, more complex combinations of signal path segments are possible to create additional signal paths in the same PCB.

Figure 1B:
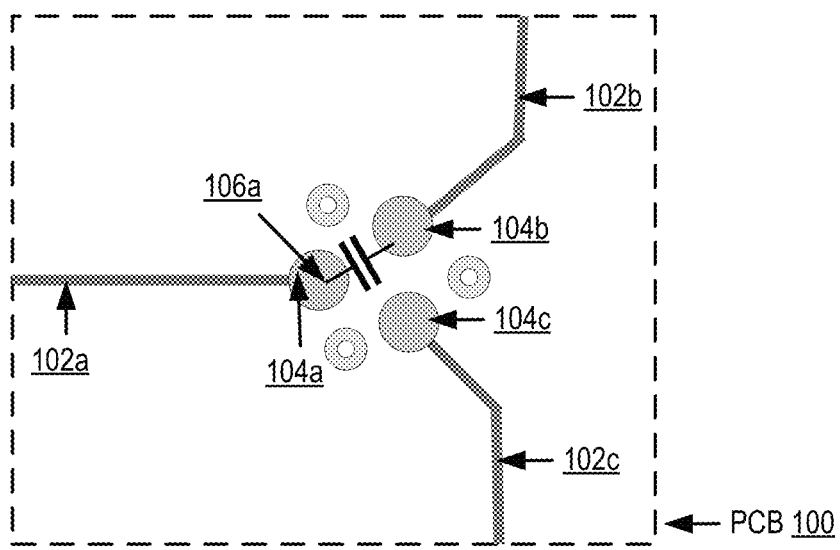
FIG. 1B is a view of an example printed circuit board (PCB) for surface mount device (SMD) placement to control a signal path in a printed circuit board.

FIG. 1B sets forth a diagram of a portion of a printed circuit board (PCB) 100 configured for surface mount device (SMD) placement to control a signal path in a PCB according to embodiments of the present invention. The PCB 100 of FIG. 1B differs from FIG. 1A in that the PCB 100 of FIG. 1B includes a capacitor 106a coupling pads 104a and 104b. Thus, a signal path is formed using signal path segments 102a and 102b. Although FIG. 1B is shown as using a capacitor 106a to couple pads 104a and 104b, it is understood that another discrete SMD (e.g., a resistor or inductor) may also be used to couple pads 104a and 104b.

Figure 1C:
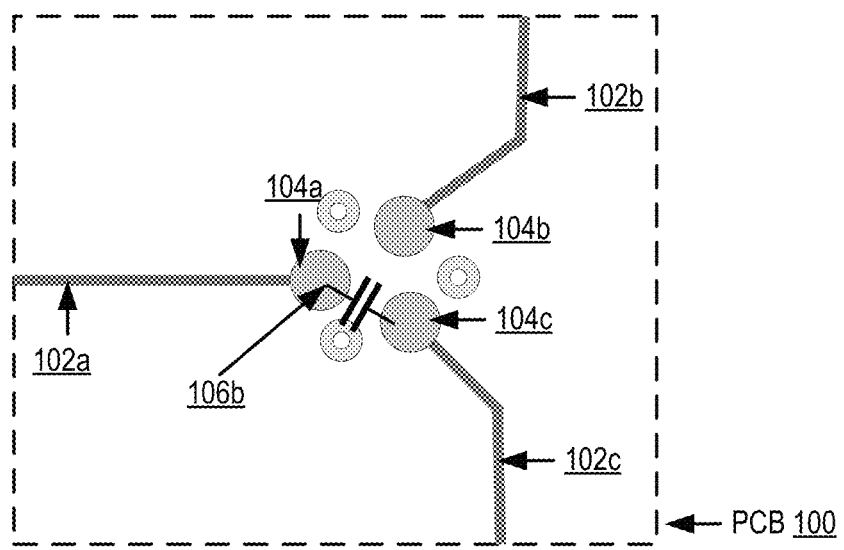
FIG. 1C is a view of an example printed circuit board (PCB) for surface mount device (SMD) placement to control a signal path in a printed circuit board.

FIG. 1C sets forth a diagram of a portion of a printed circuit board (PCB) 100 configured for surface mount device (SMD) placement to control a signal path in a PCB according to embodiments of the present invention. The PCB 100 of FIG. 1C differs from FIG. 1A in that the PCB 100 of FIG. 1C includes a capacitor 106b coupling pads 104a and 104c. Thus, a signal path is formed using signal path segments 102a and 102c. Although FIG. 1C is shown as using a capacitor 106b to couple pads 104a and 104c, it is understood that another discrete SMD (e.g., a resistor or inductor) may also be used to couple pads 104a and 104c.

Figure 1D:
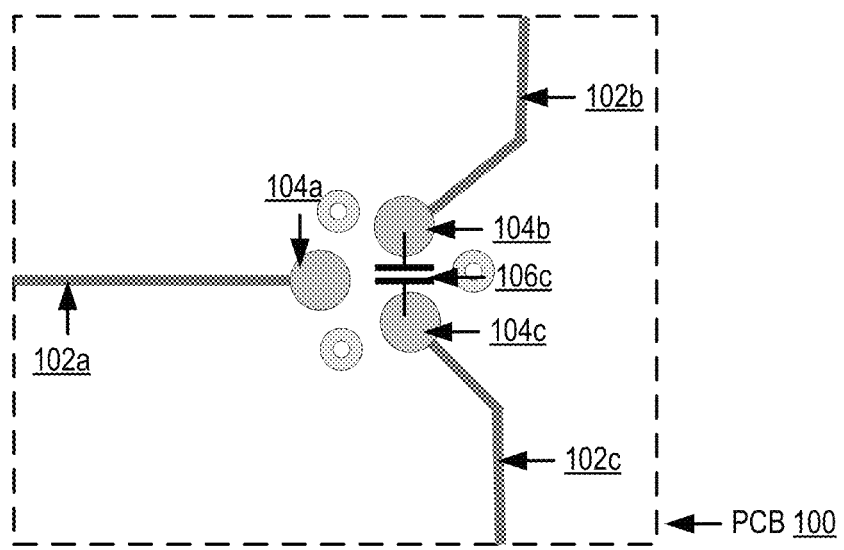
FIG. 1D is a view of an example printed circuit board (PCB) for surface mount device (SMD) placement to control a signal path in a printed circuit board.

FIG. 1D sets forth a diagram of a portion of a printed circuit board (PCB) 100 configured for surface mount device (SMD) placement to control a signal path in a PCB according to embodiments of the present invention. The PCB 100 of FIG. 1D differs from FIG. 1A in that the PCB 100 of FIG. 1D includes a capacitor 106c coupling pads 104b and 104c. Thus, a signal path is formed using signal path segments 102b and 102c. Although FIG. 1D is shown as using a capacitor 106c to couple pads 104b and 104c, it is understood that another discrete SMD (e.g., a resistor or inductor) may also be used to couple pads 104b and 104c.

Figure 2:
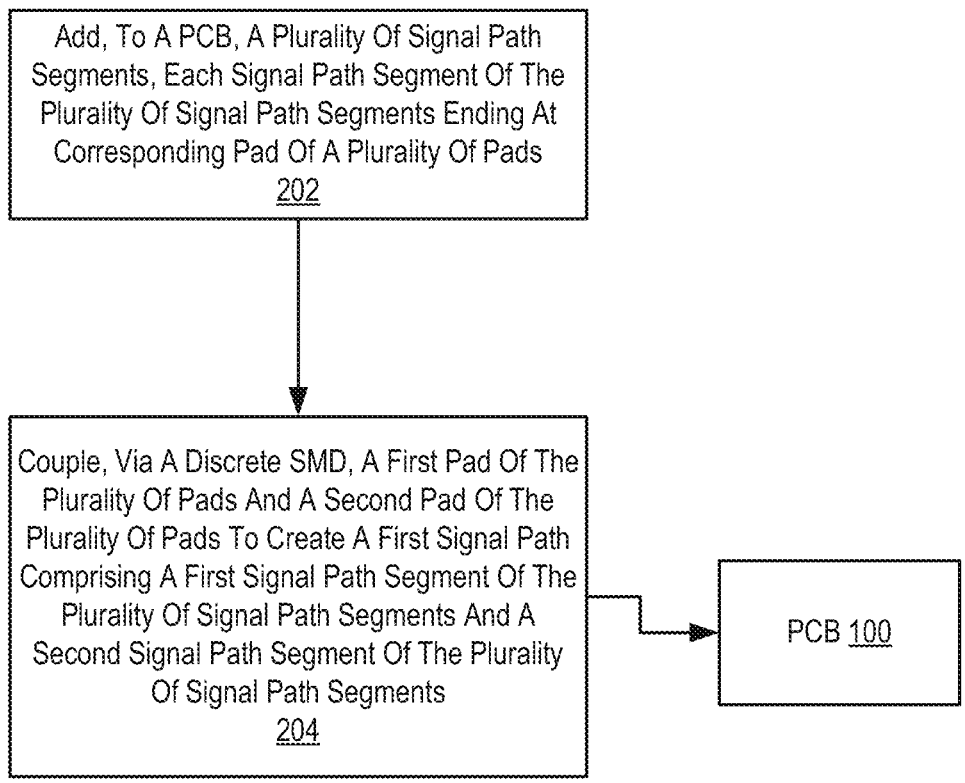
FIG. 2 is a flowchart of an example method for surface mount device (SMD) placement to control a signal path in a printed circuit board (PCB).

For further explanation, FIG. 2 sets forth a flow chart illustrating an exemplary method for surface mount device (SMD) placement to control a signal path in a printed circuit board (PCB) according to embodiments of the present invention that includes adding 202, to a PCB 100, a plurality of signal path segments 102a,b,c, each signal path segment 102a,b,c of the plurality of signal path segments 102a,b,c ending at corresponding pad of a plurality of pads 104a,b,c. Each signal path segment 102a,b,c comprises a trace or etching in the PCB 100 capable of carrying a signal. Each signal path segment 102a,b,c may also include other intermediary components, such as surface mount devices (SMDs) or other components capable of carrying a signal from a signal source to a signal destination.

The method of FIG. 2 also includes coupling 204, via a discrete surface mount device (SMD), a first pad 104a of the plurality of pads 104a,b,c and a second pad 104b of the plurality of pads 104a,b,c to create a first signal path comprising a first signal path segment 102a of the plurality of signal path segments 102a,b,c and a second signal path segment 102b of the plurality of signal path segments 102a,b,c. A third signal path segment 102c of the plurality of signal path segments 102a,b,c may be uncoupled to any other signal path segment of the plurality of signal path segments 102a,b,c. In other words, no component couples the pad 104c of the third signal path segment 102c to any other signal path segment 102a,b,c. For example, a discrete SMD may be soldered or otherwise conductively attached to a pair of pads 104a,b,c to create a signal path from a pair of corresponding signal path segments 102a,b,c. An SMD is discrete in that it does not require external power to operate. Examples of discrete SMDs include capacitors, indictors, or resistors. As the first signal path has been established, a signal may then be applied to the first signal path (e.g., an RF signal).

Figure 3:
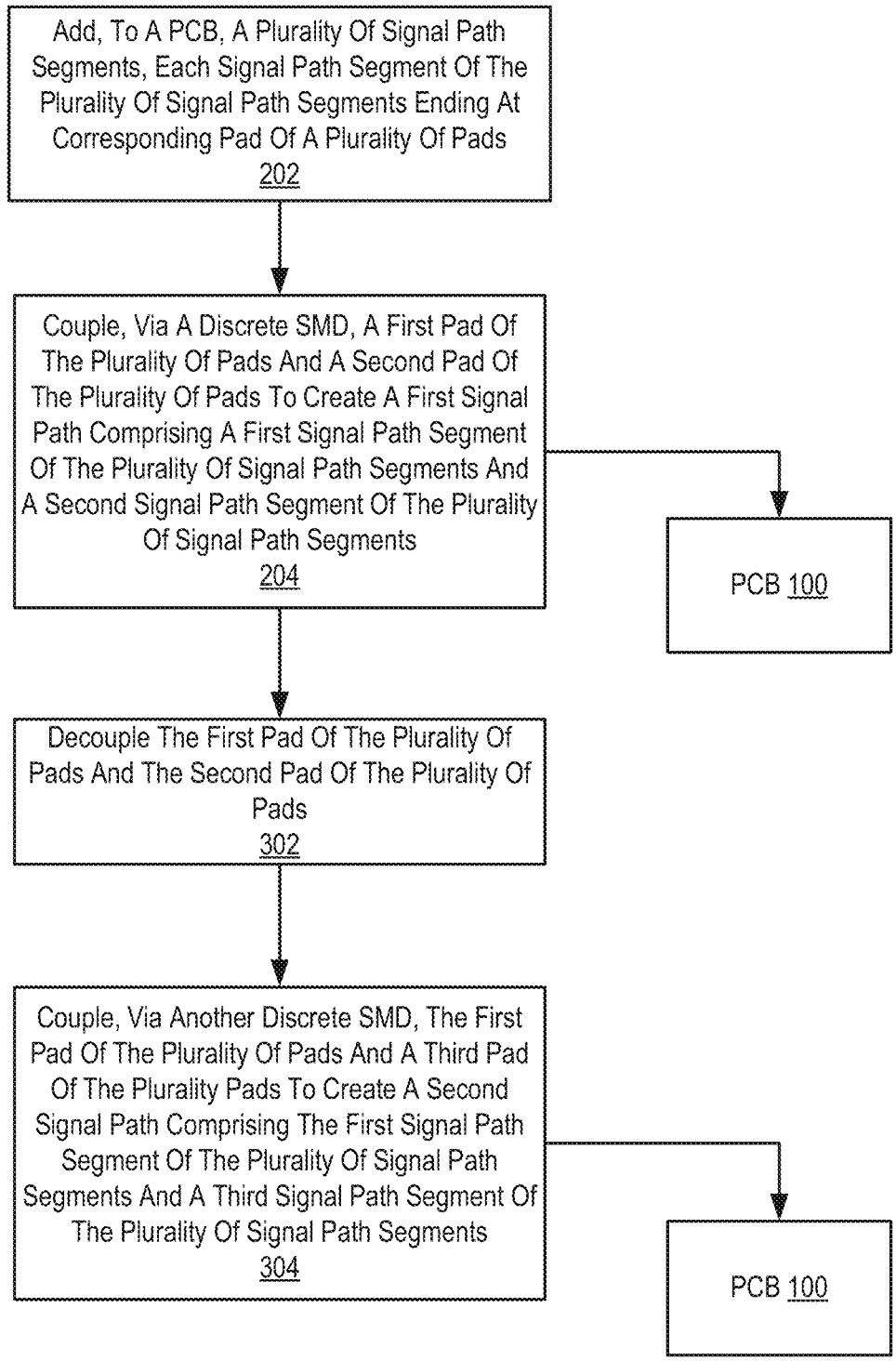
FIG. 3 is a flowchart of an example method for surface mount device (SMD) placement to control a signal path in a printed circuit board (PCB).

For further explanation, FIG. 3 sets forth a flow chart illustrating an exemplary method for surface mount device (SMD) placement to control a signal path in a printed circuit board (PCB) according to embodiments of the present invention that includes adding 202, to a PCB 100, a plurality of signal path segments 102a,b,c, each signal path segment 102a,b,c of the plurality of signal path segments 102a,b,c ending at corresponding pad of a plurality of pads 104a,b,c; and coupling 204, via a discrete surface mount device (SMD), a first pad 104a of the plurality of pads 104a,b,c and a second pad 104b of the plurality of pads 104a,b,c to create a first signal path comprising a first signal path segment 102a of the plurality of signal path segments 102a,b,c and a second signal path segment 102b of the plurality of signal path segments 102a,b,c.

The method of FIG. 3 differs from FIG. 2 in that the method of FIG. 3 also includes decoupling 302 the first pad 104a of the plurality of pads 104a,b,c and the second pad 104b of the plurality of pads 104a,b,c. For example, the discrete SMD coupling the first pad 104a of the plurality of pads 104a,b,c and the second pad 104b of the plurality of pads 104a,b,c may be removed, damaged, or otherwise affected to no longer conductively couple the first pad 104 and the second pad 104b.

The method of FIG. 3 further differs from FIG. 2 in that the method of FIG. 3 also includes coupling 304, via another discrete surface mount device (SMD), the first pad 104a of the plurality of pads 104a,b,c and a third pad 104c of the plurality of pads 104a,b,c to create a second signal path comprising the first signal path segment 102a of the plurality of signal path segments 102a,b,c and a third signal path segment 102c of the plurality of signal path segments 102a,b,c. For example, a discrete SMD (e.g., capacitor, resistor, or inductor) may be soldered to or mounted to the first pad 104a and the third pad 104c to create a conductive path between the first signal path segment 102a and the third signal path segment 102c. The discrete SMD used to couple the first pad 104a and the third pad 104c may be of the same or different type as the decoupled discrete SMD previously coupling the first pad 104a and the second pad 104b. Thus, the PCB 100 has been reconfigured to use a different signal path through SMD placement and without the use of dedicated switching hardware.

Figure 4:
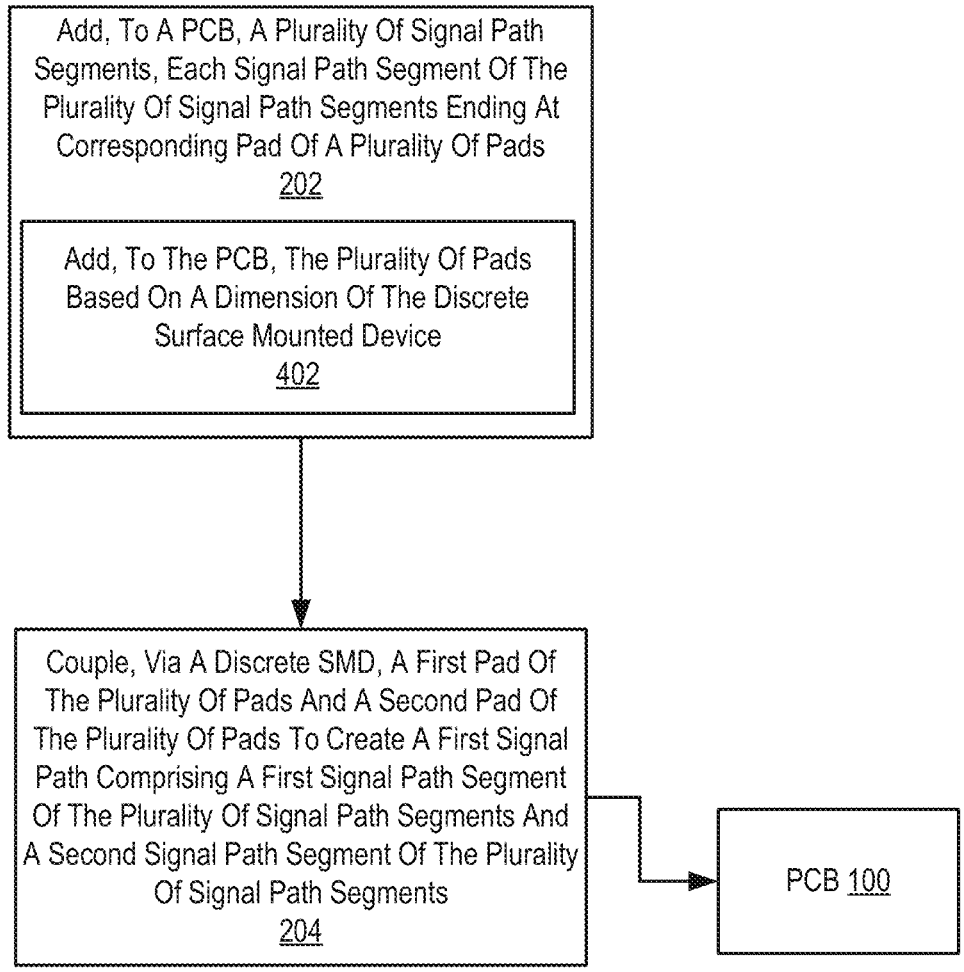
FIG. 4 is a flowchart of an example method for surface mount device (SMD) placement to control a signal path in a printed circuit board (PCB).

For further explanation, FIG. 4 sets forth a flow chart illustrating an exemplary method for surface mount device (SMD) placement to control a signal path in a printed circuit board (PCB) according to embodiments of the present invention that includes adding 202, to a PCB 100, a plurality of signal path segments 102a,b,c, each signal path segment 102a,b,c of the plurality of signal path segments 102a,b,c ending at corresponding pad of a plurality of pads 104a,b,c; and coupling 204, via a discrete surface mount device (SMD), a first pad 104a of the plurality of pads 104a,b,c and a second pad 104b of the plurality of pads 104a,b,c to create a first signal path comprising a first signal path segment 102a of the plurality of signal path segments 102a,b,c and a second signal path segment 102b of the plurality of signal path segments 102a,b,c.

The method of FIG. 4 differs from FIG. 2 in that adding 202, to a PCB 100, a plurality of signal path segments 102a,b,c, each signal path segment 102a,b,c of the plurality of signal path segments 102a,b,c ending at corresponding pad of a plurality of pads 104a,b,c includes adding 402, to the PCB 100, the plurality of pads based on a dimension of the discrete SMD. For example, assuming a known distance between pins of a capacitor, the pads 104a,b,c may be arranged such that each pad 104a,b,c is a distance from at least one other pad 104a,b,c that is less than the distance between the pins of the capacitor. This allows for a given signal path segment 102a,b,c to be couplable to two or more other signal path segments 102a,b,c, allowing for the PCB to be configured for two or more signal paths.

In view of the explanations set forth above, readers will recognize that the benefits of surface mount device (SMD) placement to control a signal path in a printed circuit board (PCB) according to embodiments of the present invention include:

Manufacture of a single type of printed circuit board that may be configured to use various signal paths depending on the placement of a discrete surface mount device.

A printed circuit board that may be reconfigured to use different signal paths by changing the placement of a discrete surface mount device, without the need for complex switching hardware that takes up larger amounts of PCB area.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A printed circuit board (PCB) for surface mount device (SMD) placement to control a signal path in a PCB, comprising:
a plurality of signal path segments, each signal path segment of the plurality of signal path segments ending at corresponding pad of a plurality of pads, wherein a first pad of the plurality of pads is couplable to a second pad of the plurality of pads to create a first signal path and is couplable to a third pad of the plurality of pads to create a second signal path;
a discrete surface mount device coupling the first pad and the second pad to create the first signal path comprising a first signal path segment of the plurality of signal path segments and a second signal path segment of the plurality of signal path segments; and
a plurality of vias, wherein each of the plurality of vias are separate from each of the plurality of pads.

2. The PCB of claim 1, wherein the second signal path comprises the first signal path segment of the plurality of signal path segments and a third signal path segment of the plurality of signal path segments.

3. The PCB of claim 1, wherein the third pad is uncoupled to any other signal path segment of the plurality of signal path segments.

4. The PCB of claim 1, wherein the discrete SMD comprises a capacitor, a resistor, or an inductor.

5. The PCB of claim 1, wherein the PCB comprises a radio frequency (RF) PCB.

6. The PCB of claim 1, wherein the plurality of pads are arranged based on a dimension of the discrete SMD.

7. The PCB of claim 1, wherein the discrete surface mount device is soldered to the first pad and the second pad.

8. An apparatus, comprising:
a printed circuit board (PCB) for surface mount device (SMD) placement to control a signal path in a PCB, comprising:
a plurality of signal path segments, each signal path segment of the plurality of signal path segments ending at corresponding pad of a plurality of pads, wherein a first pad of the plurality of pads is couplable to a second pad of the plurality of pads to create a first signal path and is couplable to a third pad of the plurality of pads to create a second signal path;

a discrete surface mount device coupling the first pad and the second pad to create the first signal path comprising a first signal path segment of the plurality of signal path segments and a second signal path segment of the plurality of signal path segments; and a plurality of vias, wherein each of the plurality of vias are separate from each of the plurality of pads.

9. The apparatus of claim 8, wherein the second signal path comprises the first signal path segment of the plurality of signal path segments and a third signal path segment of the plurality of signal path segments.

10. The apparatus of claim 8, wherein the third pad is uncoupled to any other signal path segment of the plurality of signal path segments.

11. The apparatus of claim 8, wherein the discrete SMD comprises a capacitor, a resistor, or an inductor.

12. The apparatus of claim 8, wherein the PCB comprises a radio frequency (RF) PCB.

13. The apparatus of claim 8, wherein the plurality of pads are arranged based on a dimension of the discrete SMD.

14. The apparatus of claim 8, wherein the discrete surface mount device is soldered to the first pad and the second pad.

15. A system, comprising:

an apparatus comprising a printed circuit board (PCB) for surface mount device (SMD) placement to control a signal path in a PCB, the PCB comprising:

a plurality of signal path segments, each signal path segment of the plurality of signal path segments ending at corresponding pad of a plurality of pads, wherein a first pad of the plurality of pads is couplable to a second pad of the plurality of pads to create a first signal path and is couplable to a third pad of the plurality of pads to create a second signal path;

a discrete surface mount device coupling the first pad and the second pad to create the first signal path comprising a first signal path segment of the plurality of signal path segments and a second signal path segment of the plurality of signal path segments; and a plurality of vias, wherein each of the plurality of vias are separate from each of the plurality of pads.

16. The system of claim 15, wherein the second signal path comprises the first signal path segment of the plurality of signal path segments and a third signal path segment of the plurality of signal path segments.

17. The system of claim 15, wherein the third pad is uncoupled to any other signal path segment of the plurality of signal path segments.

18. The system of claim 15, wherein the discrete SMD comprises a capacitor, a resistor, or an inductor.

19. The system of claim 15, wherein the PCB comprises a radio frequency (RF) PCB.

20. The system of claim 15, wherein the discrete surface mount device is soldered to the first pad and the second pad.

* * * * *